(12) United States Patent
Wang et al.

(10) Patent No.: US 6,472,236 B1
(45) Date of Patent: Oct. 29, 2002

(54) DETERMINATION OF EFFECTIVE OXIDE THICKNESS OF A PLURALITY OF DIELECTRIC MATERIALS IN A MOS STACK

(75) Inventors: Zhigang Wang, San Jose, CA (US); Nian Yang, San Jose, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/904,740

(22) Filed: Jul. 13, 2001

Related U.S. Application Data

(60) Provisional application No. 60/292,105, filed on May 18, 2001.

(51) Int. Cl.$^7$ .................................................. H01L 21/66
(52) U.S. Cl. ........................... 438/14; 438/216; 438/275
(58) Field of Search ........................... 438/14, 216, 275, 438/15, 16, 10, 5, 17, 18, 211

(56) References Cited

U.S. PATENT DOCUMENTS

| | | | | |
|---|---|---|---|---|
| 5,429,966 A | * | 7/1995 | Wu et al. | 437/43 |
| 5,468,666 A | * | 11/1995 | Chapman | 437/44 |
| 5,504,022 A | * | 4/1996 | Nakanishi et al. | 437/43 |
| 6,010,929 A | * | 1/2000 | Chapman | 438/226 |
| 6,110,842 A | * | 8/2000 | Okuno et al. | 438/776 |
| 6,200,861 B1 | * | 3/2001 | Wu et al. | 438/278 |
| 6,207,489 B1 | * | 3/2001 | Nam et al. | 438/240 |
| 6,214,712 B1 | * | 4/2001 | Norton | 438/591 |
| 6,277,436 B1 | * | 8/2001 | Stauf et al. | 427/126.3 |

* cited by examiner

*Primary Examiner*—Matthew Smith
*Assistant Examiner*—Renzo N. Rocchegiani
(74) *Attorney, Agent, or Firm*—Monica H. Choi

(57) ABSTRACT

System and method for determining a respective effective oxide thickness for each of first and second dielectric structures that form a MOS (metal oxide semiconductor) stack. A first plurality of test MOS (metal oxide semiconductor) stacks are formed, and each test MOS stack includes a respective first dielectric structure comprised of a first dielectric material and a respective second dielectric structure comprised of a second dielectric material. A respective deposition time for forming the respective first dielectric structure corresponding to each of the first plurality of test MOS stacks is varied such that a respective first effective oxide thickness of the respective first dielectric structure varies for the first plurality of test MOS stacks. A respective second effective oxide thickness of the respective second dielectric structure is maintained to be substantially same for each of the first plurality of test MOS stacks. A respective total effective oxide thickness, $EOT_{MOS}$, is measured for each of the first plurality of test MOS stacks. A first graph having total effective oxide thickness as a first axis and having deposition time for forming the first dielectric structure as a second axis is generated by plotting the respective total effective oxide thickness, $EOT_{MOS}$, versus the respective deposition time for forming the respective first dielectric structure for each of the first plurality of test MOS stacks. The respective second effective oxide thickness of the respective second dielectric structure that is substantially same for each of the first plurality of test MOS stacks is determined from an intercept of the first axis of total effective oxide thickness when deposition time for forming the first dielectric structure of the second axis is substantially zero in the first graph.

12 Claims, 6 Drawing Sheets

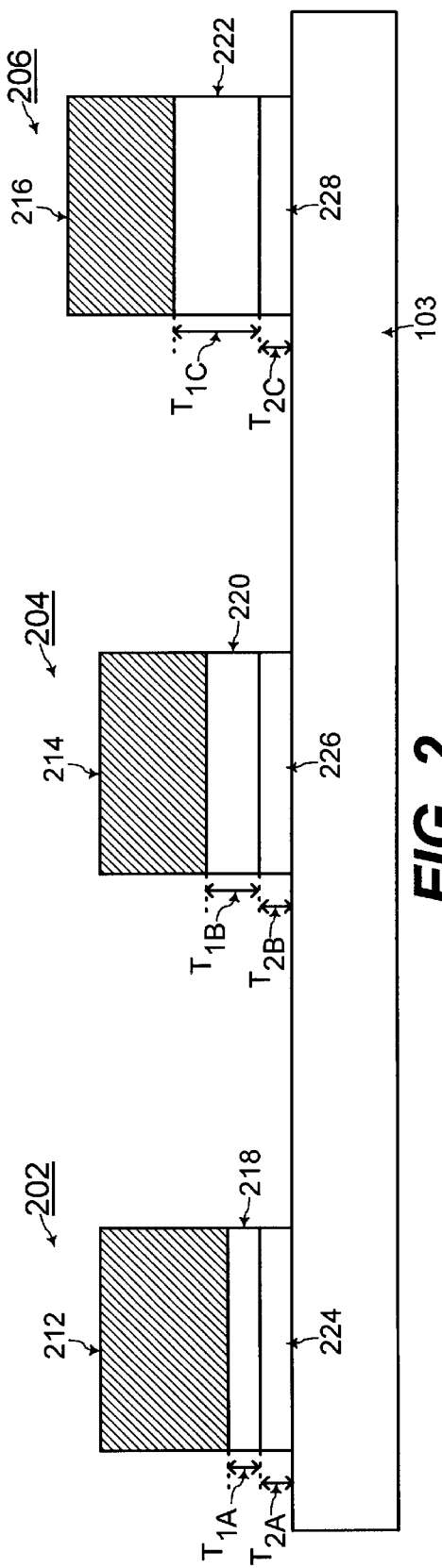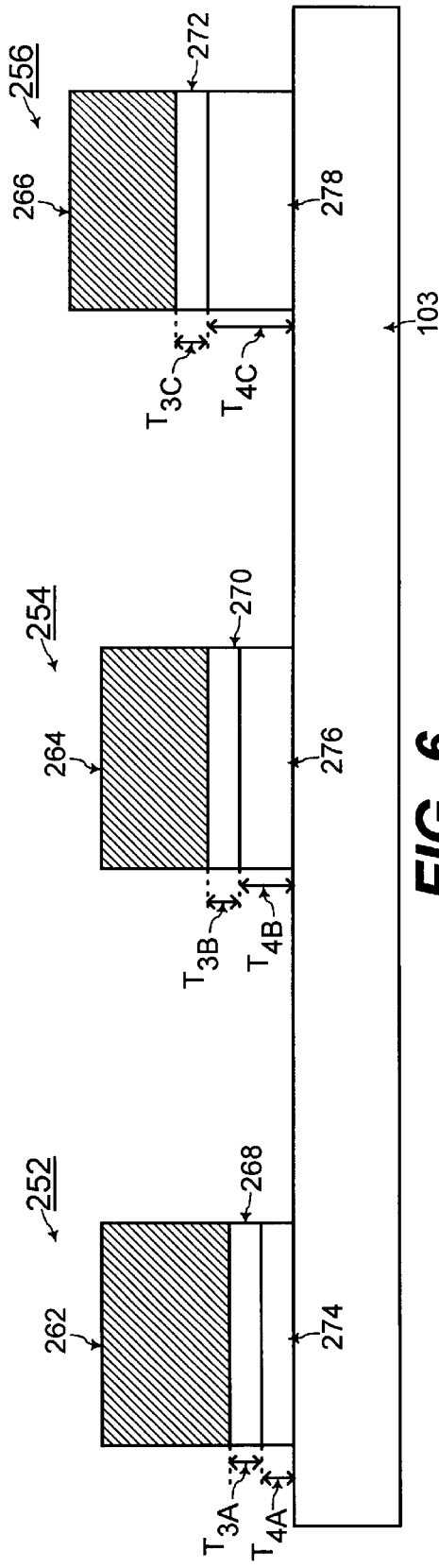

DETERMINATION OF EFFECTIVE OXIDE THICKNESS OF A PLURALITY OF DIELECTRIC MATERIALS IN A MOS STACK

This patent application claims priority from the provisional patent application with Ser. No. 60/292,105 filed on May 18, 2001 and with the same title and inventorship herewith. The provisional patent application with Ser. No. 60/292,105 is in its entirety incorporated herewith by reference.

BACKGROUND OF THE INVENTION

1. Field of the Invention

The present invention relates generally to metal oxide semiconductor (MOS) devices, and more particularly, to a mechanism for determining the respective effective oxide thickness of each of a plurality of dielectric materials forming a MOS (metal oxide semiconductor) stack.

2. Discussion of the Related Art

Referring to FIG. 1, in a MOS (metal oxide semiconductor) stack 100, a conductive structure 102 comprised of a metal (or other types of conductive material such as polysilicon for example) is formed on a high-K structure 104 comprised of a dielectric material having a dielectric constant higher than that of silicon dioxide ($SiO_2$). An interfacial structure 106 is disposed between the high-K structure 104 and the semiconductor substrate 103 to provide a smooth structural transition from the high-K structure 104 to the semiconductor substrate 103. The high-K structure 104 has a first thickness T1, and the interfacial structure 106 has a second thickness T2.

For example, the conductive structure 102 is comprised of aluminum, the high-K structure 104 is comprised of a metal oxide, the semiconductor substrate 103 is comprised of silicon, and the interfacial structure 106 is comprised of silicon dioxide ($SiO_2$). The high-K structure 104 comprised of a dielectric material having a dielectric constant higher than that of silicon dioxide ($SiO_2$) is used as MOS device dimensions are further scaled down including the thickness of the dielectric materials between the conductive structure 102 and the semiconductor substrate 103. For a given capacitance, a dielectric material with a higher dielectric constant has a higher thickness.

When the high-K structure 104 is comprised of a dielectric material having a dielectric constant higher than that of silicon dioxide ($SiO_2$), a higher thickness of the dielectric materials (including the high-K structure 104 and the interfacial structure 106) between the conductive structure 102 and the semiconductor substrate 103 is used than if simply silicon dioxide ($SiO_2$) alone were to be used. A higher thickness of the dielectric materials between the conductive structure 102 and the semiconductor substrate 103 is advantageous for minimizing tunneling current through such dielectric materials. As MOS device dimensions are scaled down such that the thickness of the dielectric materials between the conductive structure 102 and the semiconductor substrate 103 is in a range of tens of angstroms, tunneling current may be a significant source of undesired leakage current for the MOS device.

With formation of the dielectric stack including the interfacial structure 106 and the high-K structure 104, determination of the respective effective oxide thickness of each of the interfacial structure 106 and the high-K structure 104 is desired in integrated circuit design. However, as MOS device dimensions are scaled down including the thickness of the dielectric materials 104 and 106 between the conductive structure 102 and the semiconductor substrate 103, conventional prior art techniques for measuring the thickness of the dielectric materials 104 and 106 of the MOS stack 100 may not be accurate.

SUMMARY OF THE INVENTION

Accordingly, in a general aspect of the present invention, the respective effective oxide thickness of each of a plurality of dielectric materials forming MOS stacks are determined electrically by forming a plurality of test MOS (metal oxide semiconductor) stacks.

In a general aspect of the present invention, in a system and method for determining a respective effective oxide thickness for each of a first dielectric structure comprised of a first dielectric material and a second dielectric structure comprised of a second dielectric material that form a MOS (metal oxide semiconductor) stack, a first plurality of test MOS (metal oxide semiconductor) stacks are formed. Each test MOS stack is comprised of a respective first dielectric structure comprised of the first dielectric material and a respective second dielectric structure comprised of the second dielectric material.

A respective deposition time for forming the respective first dielectric structure corresponding to each of the first plurality of test MOS stacks is varied such that a respective first effective oxide thickness of the respective first dielectric structure varies for the first plurality of test MOS stacks. A respective second effective oxide thickness of the respective second dielectric structure is maintained to be substantially same for each of the first plurality of test MOS stacks. A respective total effective oxide thickness, $EOT_{MOS}$, is measured for each of the first plurality of test MOS stacks. A first graph having total effective oxide thickness as a first axis and having deposition time for forming the first dielectric structure as a second axis is generated by plotting the respective total effective oxide thickness, $EOT_{MOS}$, versus the respective deposition time for forming the respective first dielectric structure for each of the first plurality of test MOS stacks. The respective second effective oxide thickness of the respective second dielectric structure that is substantially same for each of the first plurality of test MOS stacks is determined from an intercept of the first axis of total effective oxide thickness when deposition time for forming the first dielectric structure of the second axis is substantially zero in the first graph.

In another aspect of the present invention, the respective first effective oxide thickness of the respective first dielectric structure is determined for each of the first plurality of test MOS stacks by subtracting the respective second effective oxide thickness from the respective total effective oxide thickness, $EOT_{MOS}$, for each of the first plurality of test MOS stacks.

In a further aspect of the present invention, an off-set to the second effective oxide thickness is determined by forming a second plurality of test MOS stacks. Each test MOS stack is comprised of a respective first dielectric structure comprised of the first dielectric material and a respective second dielectric structure comprised of the second dielectric material. A respective deposition time for forming the respective second dielectric structure corresponding to each of the second plurality of test MOS stacks is varied such that a respective second effective oxide thickness of the respective second dielectric structure varies for the second plurality of test MOS stacks. A respective first effective oxide thickness of the respective first dielectric structure is maintained to be substantially same for each of the second plurality of test MOS stacks.

A respective total effective oxide thickness, $EOT_{MOS}$, is measured for each of the second plurality of test MOS stacks. A second graph having total effective oxide thickness as a first axis and having deposition time for forming the second dielectric structure as a second axis is generated by plotting the respective total effective oxide thickness, $EOT_{MOS}$, versus the respective deposition time for forming the respective second dielectric structure for each of the second plurality of test MOS stacks. The respective first effective oxide thickness of the respective first dielectric structure that is substantially same for each of the second plurality of test MOS stacks is determined from an intercept of the first axis of total effective oxide thickness when deposition time for forming the second dielectric structure of the second axis is substantially zero in the second graph.

The respective second effective oxide thickness of the respective second dielectric structure for each of the second plurality of test MOS stacks is determined by subtracting the respective first effective oxide thickness from the respective total effective oxide thickness, $EOT_{MOS}$, for each of the second plurality of test MOS stacks. The off-set is determined by comparing the respective first effective oxide thicknesses and the respective second effective oxide thicknesses determined for the first plurality of test MOS stacks and determined for the second plurality of test MOS stacks.

The present invention may be used to particular advantage when the respective total effective oxide thickness, $EOT_{MOS}$, for each of the first plurality of test MOS stacks or of the second plurality of test MOS stacks is measured using a capacitance and voltage measurement system or a current and voltage measurement system.

In one embodiment of the present invention, the first dielectric material of the first dielectric structure is comprised of a high-K dielectric material having a dielectric constant higher than that of silicon dioxide ($SiO_2$). In that case, the second dielectric material of the second dielectric structure is comprised of an interfacial dielectric material disposed between a substrate and the first dielectric structure. For example, the second dielectric material of the second dielectric structure is comprised of silicon dioxide ($SiO_2$) when the first plurality of test MOS stacks are formed on a silicon substrate.

In this manner, the respective effective oxide thickness is electrically determined for each of the first dielectric structure and the second dielectric structure forming test MOS stacks. Such effective oxide thickness may be accurately determined even when the first and second dielectric structures are relatively thin in the range of angstroms.

These and other features and advantages of the present invention will be better understood by considering the following detailed description of the invention which is presented with the attached drawings.

BRIEF DESCRIPTION OF THE DRAWINGS

FIG. 2 shows a cross-sectional view of a first plurality of test MOS (metal oxide semiconductor) stacks each having a respective first dielectric structure with a thickness that varies for the first plurality of test MOS stacks and each having a respective second dielectric structure with a thickness that is substantially same for the first plurality of test MOS stacks, according to an embodiment of the present invention;

FIG. 6 shows a cross-sectional view of a second plurality of test MOS (metal oxide semiconductor) stacks each having a respective first dielectric structure with a thickness that is substantially same for the second plurality of test MOS stacks and each having a respective second dielectric structure with a thickness that varies for the second plurality of test MOS stacks, according to an embodiment of the present invention;

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 9:
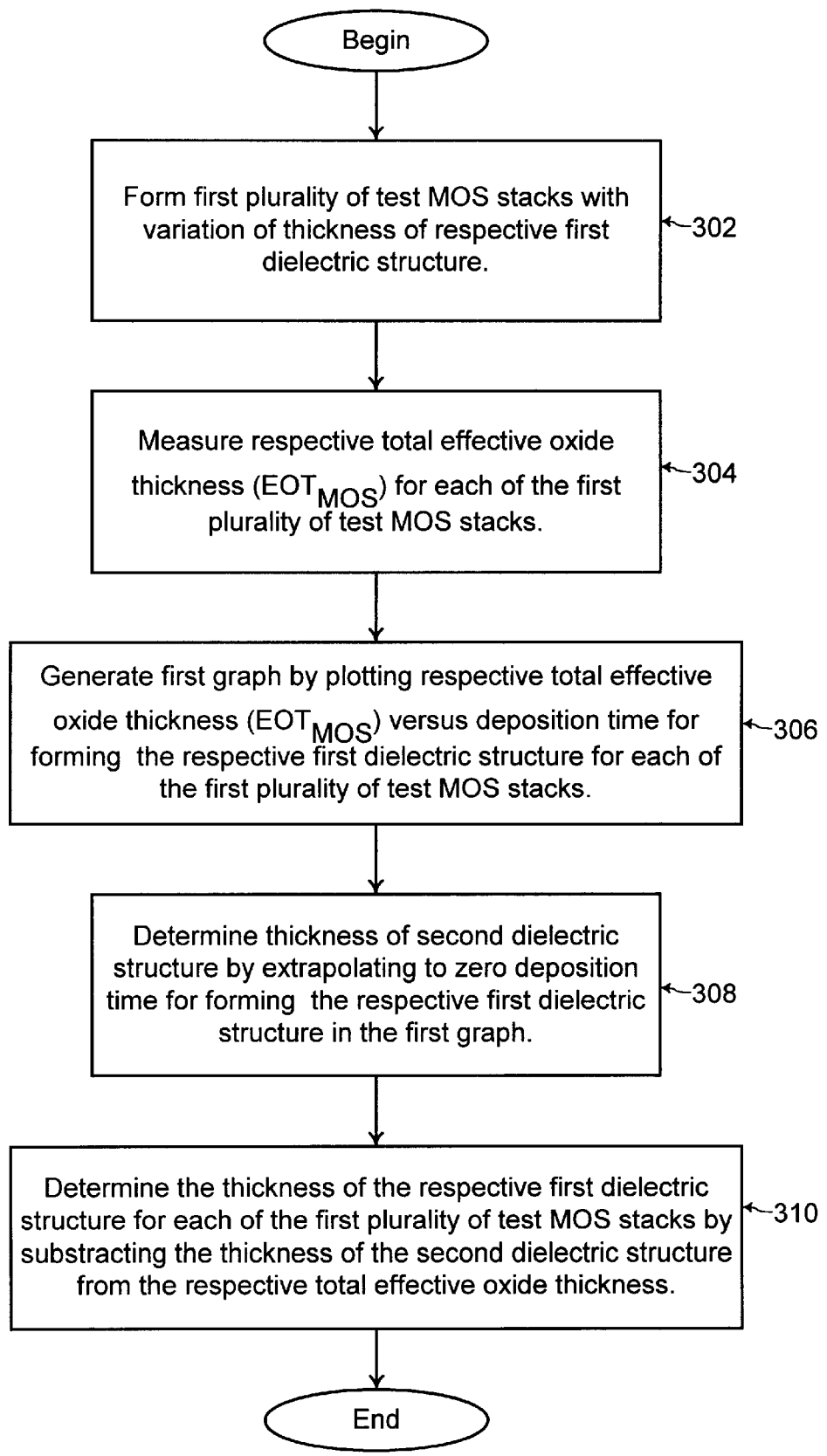
FIG. 9 shows a flowchart of steps for determining the respective thickness of each of the first and second dielectric structures of the test MOS stacks, according to an embodiment of the present invention.

FIG. 9 shows the steps of performing the present invention for determining the respective effective oxide thickness of each of a plurality of dielectric structures forming a MOS (metal oxide semiconductor) stack according to one embodiment of the present invention. Referring to FIGS. 2 and 9, a first plurality of test MOS (metal oxide semiconductor) stacks including a first test MOS stack 202, a second test MOS stack 204, and a third test MOS stack 206 are formed on the semiconductor substrate 103 (step 302 of FIG. 9). The first test MOS stack 202 includes a first conductive structure 212, the second test MOS stack 204 includes a second conductive structure 214, and the third test MOS stack 206 includes a third conductive structure 216.

Each of the first, second, and third test MOS stacks 202, 204, and 206 includes a respective first dielectric structure 218, 220, and 222, respectively, comprised of a first dielectric material and disposed below the respective conductive structures 212, 214, and 216, respectively. In addition, each of the first, second, and third test MOS stacks 202, 204, and 206 includes a respective second dielectric structure 224, 226, and 228, respectively, comprised of a second dielectric material and disposed between the semiconductor substrate 103 and the respective first dielectric structures 218, 220, and 222, respectively.

In one embodiment of the present invention, the first dielectric structures 218, 220, and 222 are comprised of a dielectric material having a dielectric constant higher than that of silicon dioxide ($SiO_2$). In that embodiment, the second dielectric structures 224, 226, and 228 are comprised of an interfacial dielectric material to provide a smooth structural transition from the first dielectric structures 218, 220, and 222 to the semiconductor substrate 103. For example, when the semiconductor substrate 103 is comprised of silicon and the first dielectric structures 218, 220, and 222 are comprised of a metal oxide, the second dielectric structures 224, 226, and 228 are comprised of silicon dioxide ($SiO_2$), in one embodiment of the present invention. Integrated circuit fabrication processes for forming such a first plurality of test MOS stacks 202, 204, and 206 are known to one of ordinary skill in the art of integrated circuit fabrication.

Further referring to FIG. 2, the respective first dielectric structure 218 of the first test MOS stack 202 has a thickness $T_{1A}$, the respective first dielectric structure 220 of the second test MOS stack 204 has a thickness $T_{1B}$, and the respective first dielectric structure 222 of the third test MOS stack 206 has a thickness $T_{1C}$. In addition, the respective second dielectric structure 224 of the first test MOS stack 202 has a thickness $T_{2A}$, the respective second dielectric structure 226 of the second test MOS stack 204 has a thickness $T_{2B}$, and the respective second dielectric structure 228 of the third test MOS stack 206 has a thickness $T_{2C}$.

In one embodiment of the present invention, the thicknesses $T_{2A}$, $T_{2B}$, and $T_{2C}$ of the respective second dielectric structures 224, 226, and 228, respectively, are maintained to be substantially the same during formation of the first plurality of test MOS stacks 202, 204, and 206. However, the deposition time for forming the respective first dielectric structures 218, 220, and 222 are varied during formation of the first plurality of test MOS stacks 202, 204, and 206 such that the thicknesses $T_{1A}$, $T_{1B}$, and $T_{1C}$ of the respective first dielectric structures 218, 220, and 222 varies for each of the first plurality of test MOS stacks 202, 204, and 206.

In the example of FIG. 2, the deposition time for forming the respective first dielectric structure 218 of the first test MOS stack 202 is shortest such that the thickness $T_{1A}$ of the respective first dielectric structure 218 for the first test MOS stack 202 is the smallest. The deposition time for forming the respective first dielectric structure 220 of the second test MOS stack 204 is longer than the deposition time for forming the respective first dielectric structure 218 of the first test MOS stack 202 such that the thickness $T_{1B}$ of the respective first dielectric structure 220 for the second test MOS stack 204 is greater than the thickness $T_{1A}$ of the respective first dielectric structure 218 for the first test MOS stack 202. The deposition time for forming the respective first dielectric structure 222 of the third test MOS stack 206 is longer than the deposition time for forming the respective first dielectric structure 220 of the second test MOS stack 204 such that the thickness $T_{1C}$ of the respective first dielectric structure 222 for the third test MOS stack 206 is greater than the thickness $T_{1B}$ of the respective first dielectric structure 220 for the second test MOS stack 204.

Figure 1:
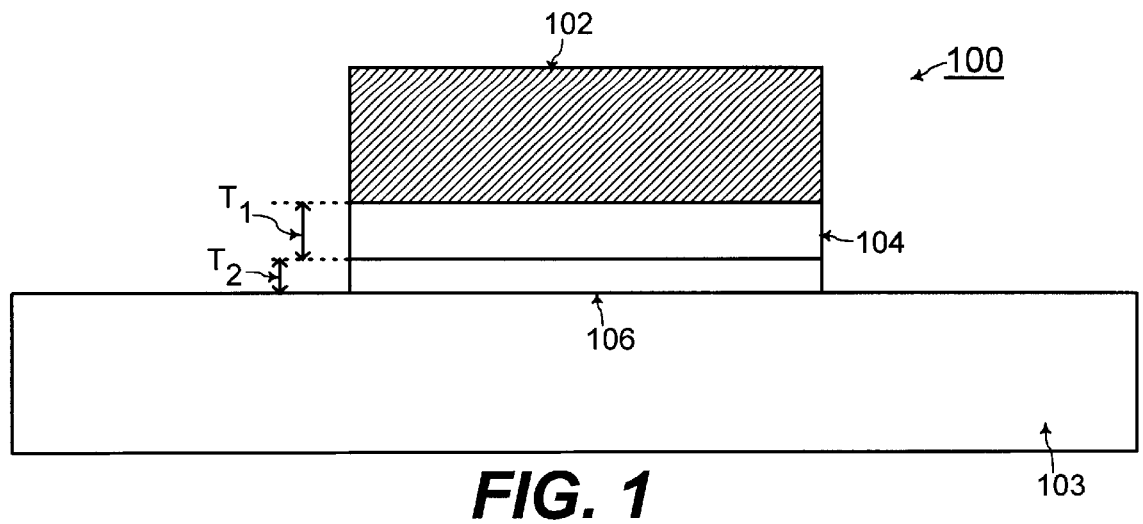
FIG. 1 shows a cross-sectional view of a MOS (metal oxide semiconductor) stack including a first dielectric structure and a second dielectric structure formed on a semiconductor substrate.
Figure 3:
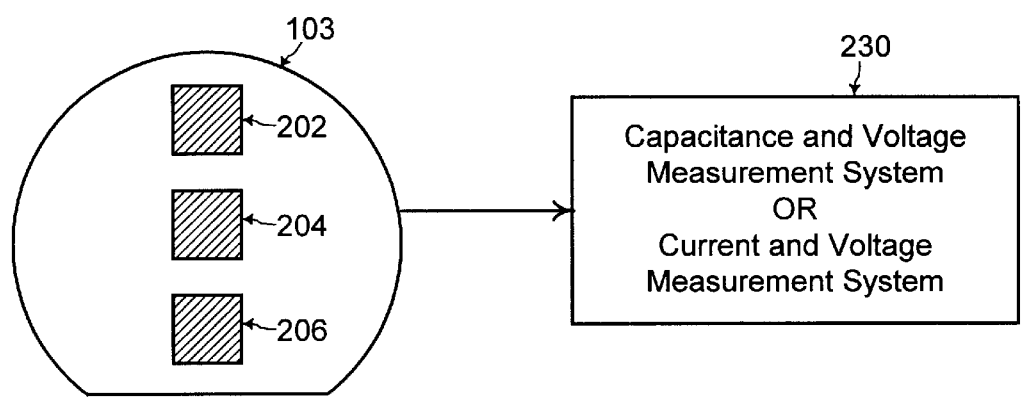
FIG. 3 shows a block diagram of a system for measuring a respective total effective oxide thickness for each of the first plurality of test MOS stacks when each of the first plurality of test MOS stacks are disposed on a same semiconductor substrate, according to an embodiment of the present invention.

Referring to FIG. 3, after formation of the first plurality of test MOS stacks 202, 204, and 206 on the semiconductor substrate 103, the total effective oxide thickness of each of the first plurality of test MOS stacks 202, 204, and 206 is measured with a capacitance and voltage measurement system or a current and voltage measurement system 230 (step 304 of FIG. 9). The respective total effective oxide thickness, $EOT_{MOS}$, corresponding to a test MOS stack is a measure of the thickness of both the respective first dielectric structure and the respective second dielectric structure for that test MOS stack. Capacitance and voltage measurement systems or current and voltage measurement systems for measuring the total effective oxide thickness, EOT, of a MOS stack such as the first plurality of test MOS stacks 202, 204, and 206 are commercially available and are known to one of ordinary skill in the art of integrated circuit fabrication.

Figure 4:
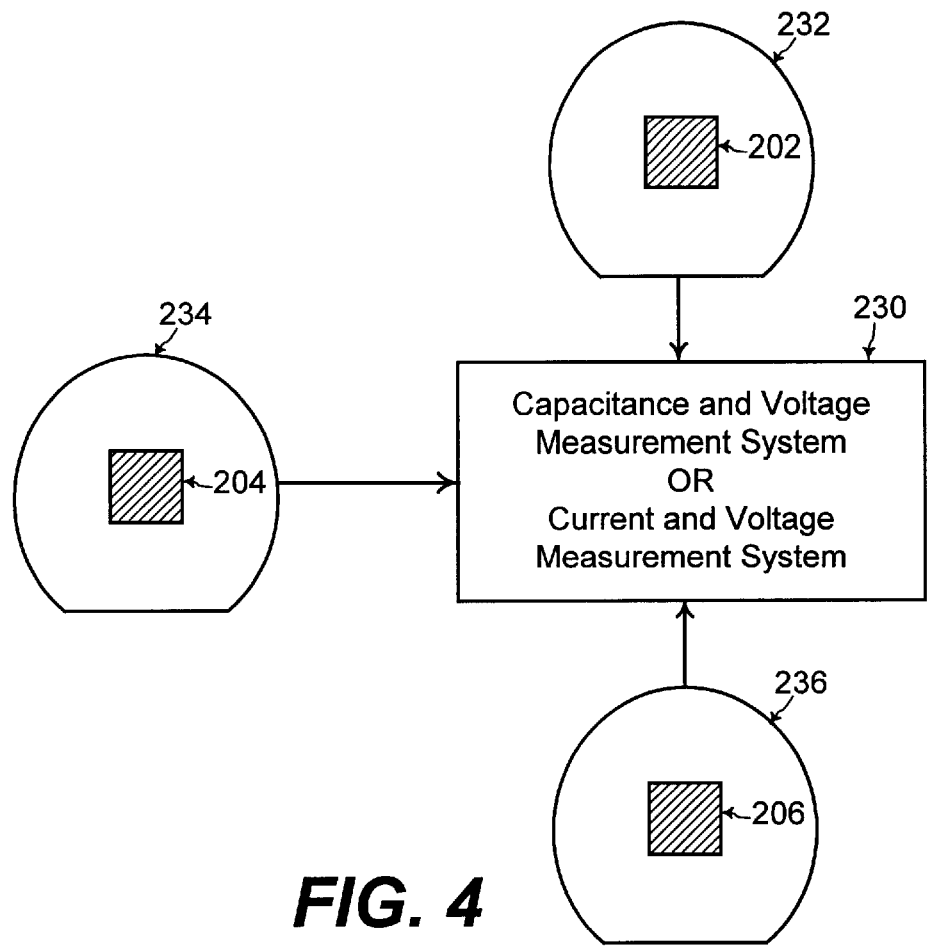
FIG. 4 shows a block diagram of a system for measuring a respective total effective oxide thickness for each of the first plurality of test MOS stacks when each of the first plurality of test MOS stacks are disposed on a different semiconductor substrate, according to an embodiment of the present invention.

Referring to FIG. 3, the first plurality of test MOS stacks 202, 204, and 206 are formed on the same semiconductor substrate 103 according to one embodiment of the present invention. Referring to FIG. 4, in another embodiment of the present invention, each of the first plurality of test MOS stacks 202, 204, and 206 are formed on a different semiconductor substrate. The first test MOS stack 202 is formed on a first semiconductor substrate 232, the second test MOS stack 204 is formed on a second semiconductor substrate 234, and the third test MOS stack 206 is formed on a third semiconductor substrate 236. In that case, each of the first, second, and third semiconductor substrates 232, 234, and 236 is placed in the capacitance and voltage measurement system or current and voltage measurement system 230 to measure the respective total effective oxide thickness, $EOT_{MOS}$, of each of the first plurality of test MOS stacks 202, 204, and 206.

Figure 5:
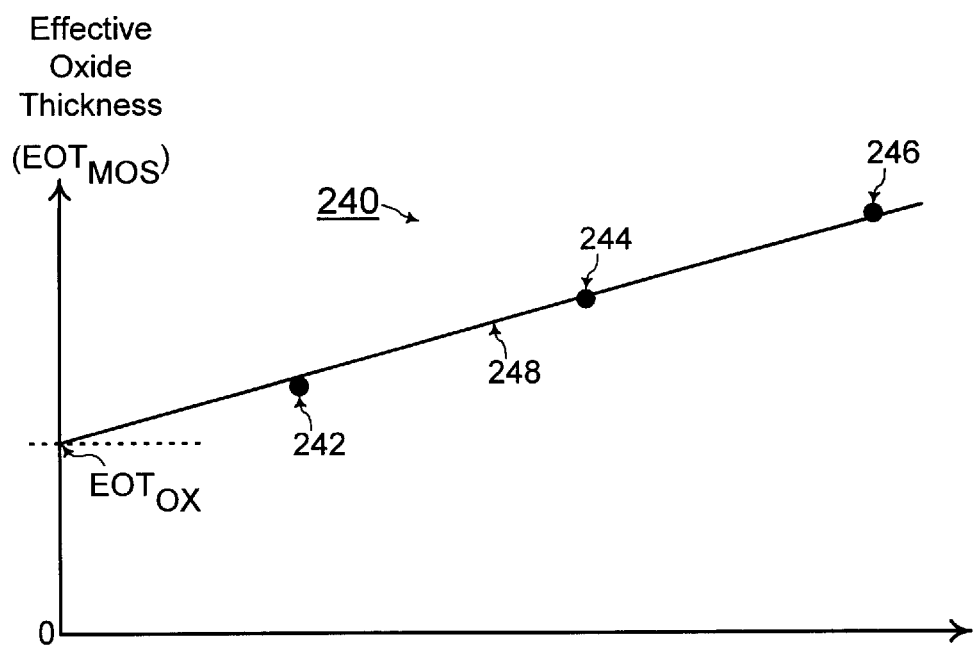
FIG. 5 shows a plot of the total effective oxide thickness versus the deposition time for forming the respective first dielectric structure for each of the first plurality of test MOS stacks, according to an embodiment of the present invention.

Referring to FIG. 5, a first graph 240 is generated by plotting the respective total effective oxide thickness, $EOT_{MOS}$, versus the deposition time for forming the respective first dielectric structure 218, 220, and 222 for each of the first plurality of test MOS stacks 202, 204, and 206 (step 306 of FIG. 9). The first graph 240 has the total effective oxide thickness as the y-axis and the deposition time for forming the respective first dielectric structure 218, 220, or 222 as the x-axis. A first data point 242 represents the respective total effective oxide thickness and the respective deposition time for forming the respective first dielectric structure 218 corresponding to the first test MOS stack 202. A second data point 244 represents the respective total effective oxide thickness and the respective deposition time for forming the respective first dielectric structure 220 corresponding to the second test MOS stack 204. A third data point 246 represents the respective total effective oxide thickness and the respective deposition time for forming the respective first dielectric structure 222 corresponding to the third test MOS stack 206.

The first graph 240 includes a line 248 that optimally fits through the data points 242, 244, and 246. Linear regression may be performed to form the line 248 that optimally fits through the data-points 242, 244, and 246. Linear regression techniques to generate such a line 248 are known to one of ordinary skill in the art of electronics. The line 248 is extrapolated to the y-axis when the deposition time for forming the first dielectric structure is substantially zero (step 308 of FIG. 9). The point of the y-axis intercept, $EOT_{OX}$, when the deposition time for forming the first dielectric structure is substantially zero, is the effective oxide thickness of each of the respective second dielectric structures 224, 226, and 228 in FIG. 2.

Referring to FIG. 2, the thicknesses $T_{2A}$, $T_{2B}$, and $T_{2C}$ of the respective second dielectric structures 224, 226, and 228, respectively, are maintained to be substantially the same during formation of the first plurality of test MOS stacks 202, 204, and 206. Thus, the effective oxide thickness, $EOT_{OX}$, of the respective second dielectric structures 224, 226, and 228 is substantially the same for each of the first plurality of test MOS stacks 202, 204, and 206.

With determination of the effective oxide thickness $EOT_{OX}$ of the respective second dielectric structure for each of the first plurality of test MOS stacks 202, 204, and 206, the effective oxide thickness $EOT_K$ of the respective first dielectric structure is determined by subtracting the effective oxide thickness $EOT_{OX}$ of the respective second dielectric structure from the respective total effective oxide thickness of a test MOS stack (step 310 of FIG. 9) as follows:

$$EOT_K = EOT_{MOS} - EOT_{OX}.$$

$EOT_{OX}$ is the effective oxide thickness of the second dielectric structure that is the same for each of the first plurality of test MOS stacks 202, 204, and 206. $EOT_{MOS}$ is the respective total effective oxide thickness of a test MOS stack. $EOT_K$ is the respective effective oxide thickness of the respective first dielectric structure of the test MOS stack.

In this manner the respective effective oxide thickness of each of the respective first dielectric structures 218, 220, and 222 and of each of the respective second dielectric structures 224, 226, and 228 is determined for each of the first, second, and third test MOS stacks 202, 204, and 206. Referring to FIG. 5, the extrapolation of the line 248 to the y-axis intercept when the deposition time for forming the first dielectric structure is substantially zero to determine the effective oxide thickness, $EOT_{OX}$, of the respective second dielectric structure assumes a linear relationship between the deposition time for forming the first dielectric structure and the thickness of the first dielectric structure. However, such an assumption may not be valid at the beginning of the deposition process since some initial time is usually required for nucleation of dielectric material forming the first dielectric structure. In that case, an off-set is determined for the effective oxide thickness, $EOT_{OX}$, of the respective second dielectric structure and the effective oxide thickness, $EOT_K$, of the respective first dielectric structure for each of the first plurality of test MOS stacks 202, 204, and 206.

Figure 10:
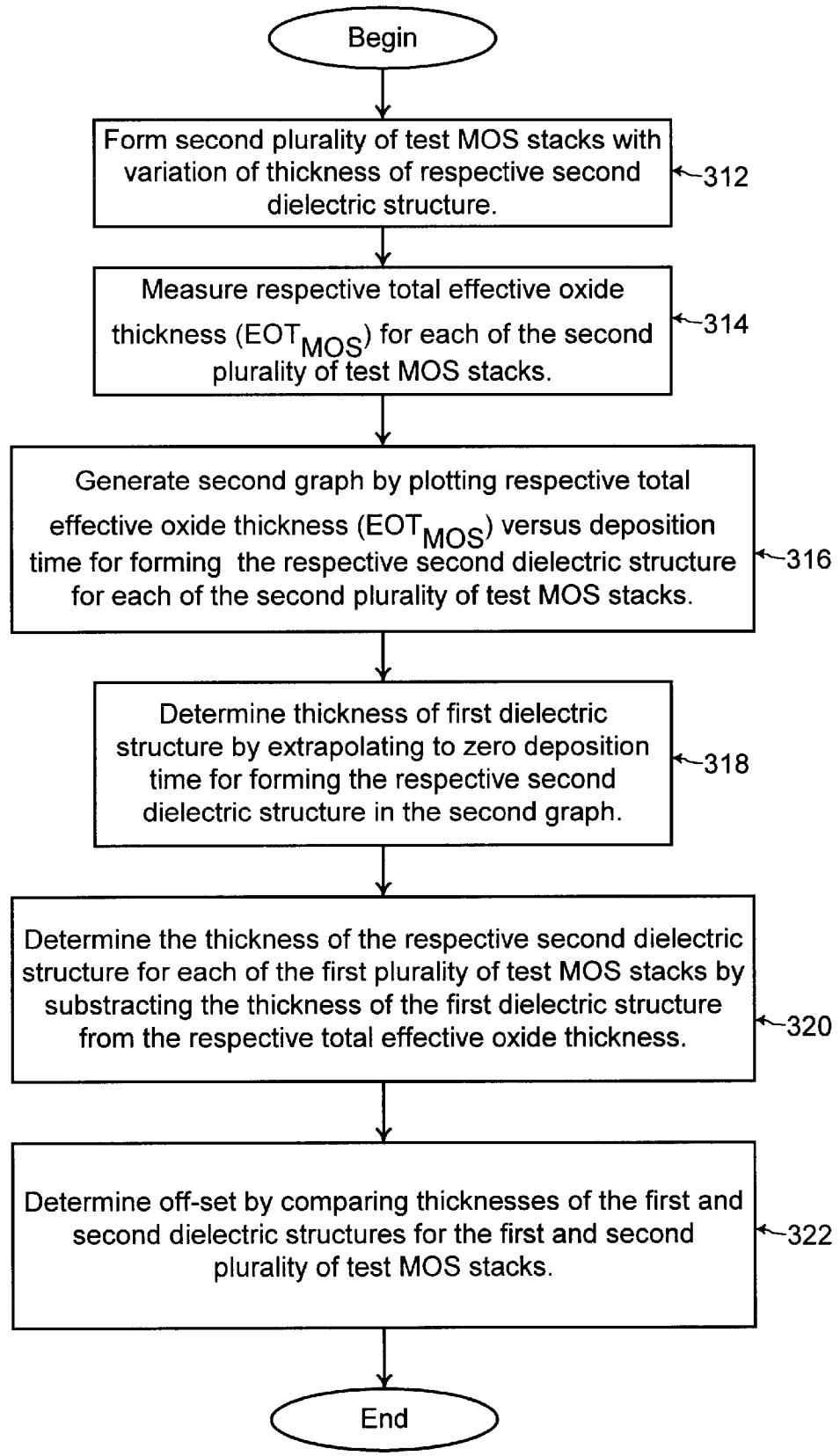
FIG. 10 shows a flowchart of steps for determining an off-set to the respective thickness of each of the first and second dielectric structures of the test MOS stacks, according to an embodiment of the present invention.

FIG. 10 shows the steps of performing the present invention for determining such an off-set according to one embodiment of the present invention. Referring to FIGS. 6 and 10, a second plurality of test MOS (metal oxide semiconductor) stacks including a fourth test MOS stack 252, a fifth test MOS stack 254, and a sixth test MOS stack 256 are formed on the semiconductor substrate 103 (step 312 of FIG. 10). The fourth test MOS stack 252 includes a fourth conductive structure 262, the fifth test MOS stack 254 includes a fifth conductive structure 264, and the sixth test MOS stack 256 includes a sixth conductive structure 266.

Each of the fourth, fifth, and sixth test MOS stacks 252, 254, and 256 includes a respective first dielectric structure 268, 270, and 272, respectively, disposed below the respective conductive structures 262, 264, and 266, respectively. The respective first dielectric structures 268, 270, and 272 of the second plurality of test MOS stacks 252, 254, and 256 are comprised of the first dielectric material forming the first dielectric structures 218, 220, and 222 of the first plurality of test MOS stacks 202, 204, and 206.

In addition, each of the fourth, fifth, and sixth test MOS stacks 252, 254, and 256 includes a respective second dielectric structure 274, 276, and 278, respectively, disposed between the semiconductor substrate 103 and the respective first dielectric structure 268, 270, and 272, respectively. The respective second dielectric structures 274, 276, and 278 of the second plurality of test MOS stacks 252, 254, and 256 are comprised of the second dielectric material forming the second dielectric structures 224, 226, and 228 of the first plurality of test MOS stacks 202, 204, and 206.

In one embodiment of the present invention, the first dielectric structures 268, 270, and 272 are comprised of a dielectric material having a dielectric constant higher than that of silicon dioxide ($SiO_2$). In that embodiment, the second dielectric structures 274, 276, and 278 are comprised of an interfacial dielectric material to provide a smooth structural transition from the first dielectric structures 268, 270, and 272 to the semiconductor substrate 103. For example, when the semiconductor substrate 103 is comprised of silicon and the first dielectric structures 268, 270, and 272 are comprised of a metal oxide, the second dielectric structures 274, 276, and 278 are comprised of silicon dioxide ($SiO_2$), in one embodiment of the present invention. Integrated circuit fabrication processes for forming such a second plurality of test MOS stacks 252, 254, and 256 are known to one of ordinary skill in the art of integrated circuit fabrication.

Further referring to FIG. 6, the respective first dielectric structure 268 of the fourth test MOS stack 252 has a thickness $T_{3A}$, the respective first dielectric structure 270 of the fifth test MOS stack 254 has a thickness $T_{3B}$, and the respective first dielectric structure 272 of the sixth test MOS stack 256 has a thickness $T_{3C}$. In addition, the respective second dielectric structure 274 of the fourth test MOS stack 252 has a thickness $T_{4A}$, the respective second dielectric structure 276 of the fifth test MOS stack 254 has a thickness $T_{4B}$, and the respective second dielectric structure 278 of the sixth test MOS stack 256 has a thickness $T_{4C}$.

In contrast to the first plurality of test MOS stacks 202, 204, and 206, the thicknesses $T_{3A}$, $T_{3B}$, and $T_{3C}$ of the respective first dielectric structures 268, 270, and 272, respectively, are maintained to be substantially the same during formation of the second plurality of test MOS stacks 252, 254, and 256. However, the deposition time for forming the respective second dielectric structures 274, 276, and 278 are varied during formation of the second plurality of test MOS stacks 252, 254, and 256 such that the thickness $T_{4A}$, $T_{4B}$, and $T_{4C}$ of the respective second dielectric structures 274, 276, and 278 varies for each of the second plurality of test MOS stacks 252, 254, and 256.

In the example of FIG. 6, the deposition time for forming the respective second dielectric structure 274 of the fourth test MOS stack 252 is shortest such that the thickness $T_{4A}$ of the respective second dielectric structure 274 for the fourth test MOS stack 252 is the smallest. The deposition time for forming the respective second dielectric structure 276 of the fifth test MOS stack 254 is longer than the deposition time for forming the respective second dielectric structure 274 of the fourth test MOS stack 252 such that the thickness $T_{4B}$ of the respective second dielectric structure 276 for the fifth test MOS stack 254 is greater than the thickness $T_{4A}$ of the respective second dielectric structure 274 for the fourth test MOS stack 252. The deposition time for forming the respective second dielectric structure 278 of the sixth test MOS stack 256 is longer than the deposition time for forming the respective second dielectric structure 276 of the fifth test MOS stack 254 such that the thickness $T_{4C}$ of the respective second dielectric structure 278 for the sixth test MOS stack 256 is greater than the thickness $T_{4B}$ of the respective second dielectric structure 276 for the fifth test MOS stack 254.

Figure 7:
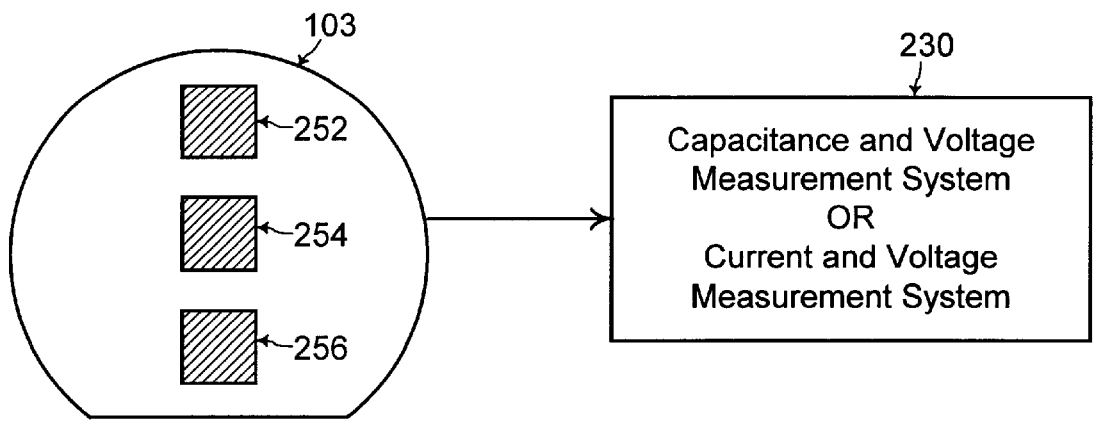
FIG. 7 shows a block diagram of a system for measuring a respective total effective oxide thickness for each of the second plurality of test MOS stacks when each of the second plurality of test MOS stacks are disposed on a same semiconductor substrate, according to an embodiment of the present invention.

Referring to FIG. 7, after formation of the second plurality of test MOS stacks 252, 254, and 256 on the semiconductor substrate 103, the total effective oxide thickness of each of the second plurality of test MOS stacks 252, 254, and 256 is measured with the capacitance and voltage measurement system or current and voltage measurement system 230 (step 314 of FIG. 10). The respective total effective oxide thickness, $EOT_{MOS}$, corresponding to a test MOS stack is a measure of the thickness of both the respective first dielectric structure and the second dielectric structure for that test MOS stack. Capacitance and voltage measurement systems or current and voltage measurement systems for measuring the total effective oxide thickness, EOT, of a MOS stack such as the second plurality of test MOS stacks 252, 254, and 256 are commercially available and are known to one of ordinary skill in the art of integrated circuit fabrication.

Figure 8:
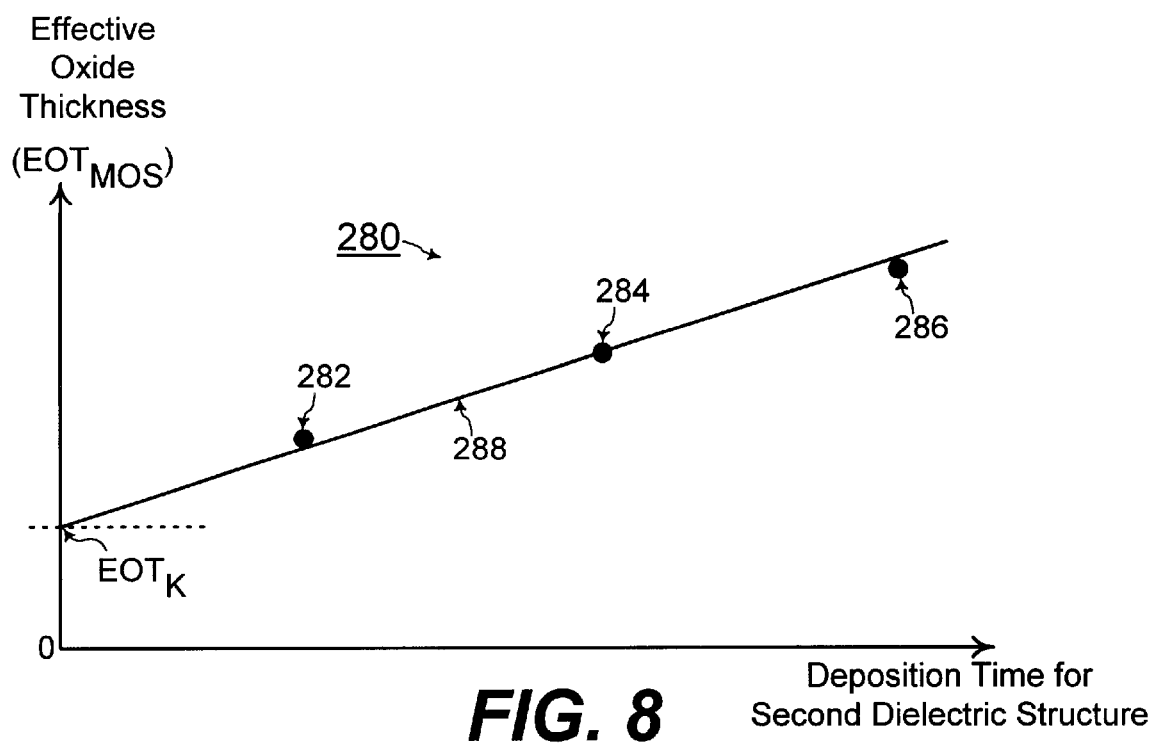
FIG. 8 shows a plot of the total effective oxide thickness versus the deposition time for forming the respective second dielectric structure for each of the second plurality of test MOS stacks, according to an embodiment of the present invention.

Referring to FIG. 8, a second graph 280 is generated by plotting the respective total effective oxide thickness, $EOT_{MOS}$, versus the deposition time for forming the respective second dielectric structure 274, 276, and 278 for each of the second plurality of test MOS stacks 252, 254, and 256 (step 316 of FIG. 10). The second graph 280 has the total effective oxide thickness as the y-axis and the deposition time for forming the respective second dielectric structure 274, 276, and 278 as the x-axis. A first data point 282 represents the respective total effective oxide thickness and the respective deposition time for forming the respective second dielectric structure 274 corresponding to the fourth test MOS stack 252. A second data point 284 represents the respective total effective oxide thickness and the respective deposition time for forming the respective second dielectric structure 276 corresponding to the fifth test MOS stack 254. A third data point 286 represents the respective total effective oxide thickness and the respective deposition time for forming the respective second dielectric structure 278 corresponding to the sixth test MOS stack 256.

The second graph 280 includes a line 288 that optimally fits through the data points 282, 284, and 286. Linear regression may be performed to form the line 288 that optimally fits through the data-points 282, 284, and 286. Linear regression techniques to generate such a line 288 are known to one of ordinary skill in the art of electronics. The line 288 is extrapolated to the y-axis when the deposition time for forming the second dielectric structure is substantially zero (step 318 of FIG. 10). The point of the y-axis intercept, $EOT_K$, when the deposition time for forming the second dielectric structure is substantially zero, is the effective oxide thickness of each of the respective first dielectric structures 268, 270, and 272 in FIG. 6.

Referring to FIG. 6, the thicknesses $T_{3A}$, $T_{3B}$, and $T_{3C}$ of the respective first dielectric structures 268, 270, and 272, respectively, are maintained to be substantially the same during formation of the second plurality of test MOS stacks 252, 254, and 256. Thus, the effective oxide thickness, $EOT_K$, of the respective first dielectric structures 268, 270, and 272 is substantially the same for each of the second plurality of test MOS stacks 252, 254, and 256.

With determination of the effective oxide thickness $EOT_K$ of the respective first dielectric structure for each of the second plurality of test MOS stacks 252, 254, and 256, the effective oxide thickness $EOT_{OX}$ of the respective second dielectric structure is determined by subtracting the effective oxide thickness $EOT_K$ of the respective first dielectric structure from the respective total effective oxide thickness of a test MOS stack (step 320 of FIG. 10) as follows:

$$EOT_{OX} = EOT_{MOS} - EOT_K.$$

$EOT_K$ is the effective oxide thickness of the first dielectric structure that is the same for each of the second plurality of test MOS stacks 252, 254, and 256. $EOT_{MOS}$ is the respective total effective oxide thickness of a test MOS stack. $EOT_{OX}$ is the respective effective oxide thickness of the respective second dielectric structure of the test MOS stack.

In this manner the respective effective oxide thickness of each of the respective first dielectric structures 268, 270, and 272 and of each of the respective second dielectric structures 274, 276, and 278 is determined for each of the fourth, fifth, and sixth test MOS stacks 252, 254, and 256. The off-set error, due to the non-linear relationship between the deposition time for forming a dielectric structure and the thickness of the dielectric structure at the beginning of the deposition process from nucleation of dielectric material, is determined by comparing the values of the effective oxide thicknesses of the respective first and second dielectric structures of the first plurality of test MOS stacks 202, 204, and 206 and of the second plurality of test MOS stacks 252, 254, and 256 (step 322 of FIG. 10).

For example, assume that with the first plurality of test MOS structures, 502, 504, and 506, $EOT_{OX}$ is determined to be 15 angstroms. Assume that $EOT_{MOS}$ for one of the first plurality of test MOS structures is measured to be 40 angstroms such that $EOT_K$ for that test MOS structure is 25 angstroms. Then, the second plurality of test MOS structures 252, 254, and 256 are formed such that $EOT_K$ for each of the second plurality of test MOS structures in the second set is desired to be 25 angstroms. However, assume that the second plot 280 of FIG. 8 for this second plurality of test MOS structures 252, 254, and 256 indicates that $EOT_K$=23 angstroms. From the plot of FIG. 8, if the $EOT_{MOS}$ for one of the second plurality of test MOS structures is determined to be 40 angstroms, then the $EOT_{OX}$ is actually 17 angstroms instead of 15 angstroms as determined by the first plurality of test MOS structures. In that case, an off-set of 2 angstroms results for $EOT_{OX}$ and $EOT_K$. An off-set of 2 angstroms is added to the effective oxide thickness of a respective second dielectric structure, $EOT_{OX}$, that is determined using the first plurality of test MOS structures, and an off-set of 2 angstroms is subtracted from the effective oxide thickness of a respective first dielectric structure, $EOT_K$, that is determined using the first plurality of test MOS structures.

In this manner, the respective effective oxide thickness is electrically determined for each of the first dielectric structure and the second dielectric structure forming test MOS stacks. Such effective oxide thickness may be accurately determined even when the first and second dielectric structures are relatively thin in the range of angstroms.

The foregoing is by way of example only and is not intended to be limiting. For example, any specified material or any specified dimension of any structure described herein is by way of example only. Furthermore, other number of test MOS stacks may be formed for the first or second plurality of test MOS stacks. Three test MOS stacks are illustrated and described herein for each of the first and second plurality of test MOS stacks for clarity of illustration.

In addition, as will be understood by those skilled in the art, the structures described herein may be made or used in the same way regardless of their position and orientation. Accordingly, it is to be understood that terms and phrases such as "on" and "between" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for determining a respective effective oxide thickness for each of a first dielectric structure comprised of a first dielectric material and a second dielectric structure comprised of a second dielectric material that form a MOS (metal oxide semiconductor) stack, the method including the steps of:

A. forming a first plurality of test MOS (metal oxide semiconductor) stacks with each test MOS stack being comprised of a respective first dielectric structure comprised of said first dielectric material and a respective second dielectric structure comprised of said second dielectric material;

B. varying a respective deposition time for forming said respective first dielectric structure corresponding to each of said first plurality of test MOS stacks during said step A such that a respective first effective oxide thickness of said respective first dielectric structure varies for said first plurality of test MOS stacks;

C. maintaining a respective second effective oxide thickness of said respective second dielectric structure to be substantially same for each of said first plurality of test MOS stacks during said step A;

D. measuring a respective total effective oxide thickness, $EOT_{MOS}$, for each of said first plurality of test MOS stacks;

E. generating a first graph having total effective oxide thickness as a first axis and having deposition time for forming said first dielectric structure as a second axis by plotting said respective total effective oxide thickness, $EOT_{MOS}$, versus said respective deposition time for forming said respective first dielectric structure for each of said first plurality of test MOS stacks; and F. determining said respective second effective oxide thickness of said respective second dielectric structure that is substantially same for each of said first plurality of test MOS stacks from an intercept of said first axis of total effective oxide thickness when deposition time for forming said first dielectric structure of said second axis is substantially zero in said first graph.

2. The method of claim 1, further including the step of:

G. determining said respective first effective oxide thickness of said respective first dielectric structure for each of said first plurality of test MOS stacks by subtracting said respective second effective oxide thickness determined in said step F from said respective total effective oxide thickness, $EOT_{MOS}$, for each of said first plurality of test MOS stacks.

3. The method of claim 1, further including the step of:

H. determining an off-set to said respective second effective oxide thickness of said respective second dielectric structure determined in said step F.

4. The method of claim 3, wherein said step H includes the steps of:

I. forming a second plurality of test MOS (metal oxide semiconductor) stacks with each test MOS stack being comprised of a respective first dielectric structure comprised of said first dielectric material and a respective second dielectric structure comprised of said second dielectric material;

J. varying a respective deposition time for forming said respective second dielectric structure corresponding to each of said second plurality of test MOS stacks during said step I such that a respective second effective oxide thickness of said respective second dielectric structure varies for said second plurality of test MOS stacks;

K. maintaining a respective first effective oxide thickness of said respective first dielectric structure to be substantially same for each of said second plurality of test MOS stacks during said step I;

L. measuring a respective total effective oxide thickness, $EOT_{MOS}$, for each of said second plurality of test MOS stacks;

M. generating a second graph having total effective oxide thickness as a first axis and having deposition time for forming said second dielectric structure as a second axis by plotting said respective total effective oxide thickness, $EOT_{MOS}$, versus said respective deposition time for forming said respective second dielectric structure for each of said second plurality of test MOS stacks;

N. determining said respective first effective oxide thickness of said respective first dielectric structure that is substantially same for each of said second plurality of test MOS stacks from an intercept of said first axis of total effective oxide thickness when deposition time for forming said second dielectric structure of said second axis is substantially zero in said second graph;

O. determining said respective second effective oxide thickness of said respective second dielectric structure for each of said second plurality of test MOS stacks by subtracting said respective first effective oxide thickness determined in said step N from said respective total effective oxide thickness, $EOT_{MOS}$, for each of said second plurality of test MOS stacks; and P. determining said off-set by comparing said respective first effective oxide thicknesses and said respective second effective oxide thicknesses determined for said first plurality of test MOS stacks and determined for said second plurality of test MOS stacks.

5. The method of claim 1, further including the step of:

forming a respective conductive structure on top of said first dielectric structure and said second dielectric structure for each of said first plurality of test MOS stacks.

6. The method of claim 5, wherein said first dielectric material of said first dielectric structure is comprised of a high-K dielectric material having a dielectric constant higher than that of silicon dioxide ($SiO_2$).

7. The method of claim 6, wherein said second dielectric material of said second dielectric structure is comprised of an interfacial dielectric material disposed between a substrate and said first dielectric structure.

8. The method of claim 7, wherein said second dielectric material of said second dielectric structure is comprised of silicon dioxide ($SiO_2$) when said first plurality of test MOS stacks are formed on a silicon substrate.

9. The method of claim 1, wherein said respective total effective oxide thickness, $EOT_{MOS}$, of each of said first plurality of test MOS stacks is measured using a capacitance and voltage measurement system.

10. The method of claim 1, wherein said respective total effective oxide thickness, $EOT_{MOS}$, of each of said first plurality of test MOS stacks is measured using a current and voltage measurement system.

11. The method of claim 1, wherein each of said first plurality of test MOS stacks are disposed on a same semiconductor substrate.

12. The method of claim 1, wherein each of said first plurality of test MOS stacks is disposed on a different semiconductor substrate.

* * * * *